United States Patent
Lin et al.

(10) Patent No.: US 11,133,280 B2
(45) Date of Patent: Sep. 28, 2021

(54) INTEGRATED CIRCUIT CHIP AND CONFIGURATION ADJUSTMENT METHOD FOR THE SAME

(71) Applicant: REALTEK SEMICONDUCTOR CORP., Hsinchu (TW)

(72) Inventors: Chung-Chang Lin, Hsinchu County (TW); Ching-Kuang Wang, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 182 days.

(21) Appl. No.: 16/671,236

(22) Filed: Nov. 1, 2019

(65) Prior Publication Data

US 2020/0312809 A1    Oct. 1, 2020

(30) Foreign Application Priority Data

Mar. 26, 2019 (TW) .................................. 108110402

(51) Int. Cl.
*H05K 1/02* (2006.01)
*H01L 23/00* (2006.01)

(52) U.S. Cl.
CPC ........... *H01L 24/45* (2013.01); *H05K 1/0234* (2013.01); *H05K 1/0293* (2013.01)

(58) Field of Classification Search
CPC ..... H01L 24/45; H05K 1/0234; H05K 1/0293
See application file for complete search history.

(56) References Cited

U.S. PATENT DOCUMENTS

| 8,513,708 B2 | 8/2013 | Chang et al. |
| 2008/0143423 A1 | 6/2008 | Komatsu et al. |
| 2019/0107562 A1 | 4/2019 | Hsieh et al. |

FOREIGN PATENT DOCUMENTS

| TW | 200839953 A | 10/2008 |
| TW | 200847305 A | 12/2008 |
| TW | 201725639 A | 7/2017 |

*Primary Examiner* — Jeremy C Norris
(74) *Attorney, Agent, or Firm* — Li & Cai Intellectual Property (USA) Office

(57) ABSTRACT

An integrated circuit chip includes a core circuit, a first bond pad, a first switch circuit, a second configuration resistor, a control circuit, and a storage unit. The first bonding pad is coupled to a first external reference voltage through a first node, and the first node is coupled to the first external reference voltage through a bonding wire or a first configuration resistor. The first switch circuit is coupled between a first internal reference voltage and the first node. The second configuration resistor is coupled between the first internal reference voltage and the first switch circuit or between the first switch circuit and the first node. In a first mode, the control circuit turns on the first switch circuit, and writes a configuration state of the first bonding pad to the storage unit. In a second mode, the control circuit turns off the first switch circuit.

18 Claims, 6 Drawing Sheets

INTEGRATED CIRCUIT CHIP AND CONFIGURATION ADJUSTMENT METHOD FOR THE SAME

CROSS-REFERENCE TO RELATED PATENT APPLICATION

This application claims the benefit of priority to Taiwan Patent Application No. 108110402, filed on Mar. 26, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an integrated circuit chip and a configuration adjustment method for the same, and more particularly to an integrated circuit chip and a configuration adjustment method for the same capable of reducing power consumption.

BACKGROUND OF THE DISCLOSURE

Integrated circuit chips often use input/output pads for chip configuration. For example, if a bonding option pad is set to be configured as "0", the bonding option pad can be coupled to a ground end through a bonding wire in a package of the chip. If the bonding option pad is set to be configured as "1", the bonding option pad can be coupled to a power inside the chip through a bonding wire in the package, so that the integrated circuit chip can be configured in different configurations.

In general, coupling the input/output pad to the internal power (such as VDD end) or ground end (GND end) inside the package can be difficult. Therefore, a voltage level is often pulled to high or low potential by using a built-in resistor for the bonding option pad. When a bonding option setting is different from a direction in which the voltage level is pulled to high or low potential, the input/output pad can be coupled to the power or ground end through the bonding wire. When the bonding option setting is the same as the direction in which the voltage level is pulled to high or low potential, the input/output pad can directly be in a state of non-connection. In this way, the above-mentioned limitations for achieving the bonding option inside the package can be overcome. However, when the direction from the bonding option setting is different from the direction in which the voltage level is pulled to high or low potential, a DC leakage path may be formed, thus the power consumption for the integrated circuit chip may be increased.

Furthermore, integrated circuit chips utilize hardware strapping for chip configuration. If a pin of the chip is set to be configured as "0", the pin can be coupled to ground end through a resistor on a printed circuit board. If the pin is set to be configured as "1", the pin can be coupled to a power through a resistor on the printed circuit board. In this way, the integrated circuit chip can be set to different configurations. In certain cases, in order to reduce a number of resistors used on the printed circuit board, a voltage level of an input pad or an output pad is pulled to high or low potential by a built-in resistor from the inside of the chip. When a hardware strapping setting is different from a direction for pulling the voltage level to high or low potential, the input/output pin can be coupled to the power or ground end via a resistor. When the hardware strapping setting is the same as the direction for pulling the voltage level to the high or low potential, the input/output pin can directly be in a state of non-connection.

In this way, when the hardware strapping setting is the same as the direction for pulling the voltage level of the input/outlet pad to the high or low potential, the number of the resistor used on the printed circuit board can be reduced. However, when the hardware strapping setting is different from the direction for pulling the voltage level of the input/output pad to high or low potential, a DC leakage path may be formed which causes an increase in power consumption for the integrated circuit chip.

Therefore, improving a circuit design for the integrated circuit chip to avoid the DC leakage path and reduce the power consumption has become an important topic in the related art.

SUMMARY OF THE DISCLOSURE

In response to the above-referenced technical inadequacies, the present disclosure provides an integrated circuit chip and a configuration adjustment method for the same capable of reducing power consumption.

In one aspect, the present disclosure provides an integrated circuit chip including a core circuit, a first bonding pad, a first switch circuit, a second configuration resistor, a control circuit, and a storage unit. The first bonding pad is coupled to the core circuit and coupled to a first external reference voltage through a first node, the first node is coupled to the first external reference voltage through a bonding wire or a first configuration resistor. The first switch circuit is coupled between a first internal reference voltage and the first node. The second configuration resistor is coupled between the first internal reference voltage and the first switch circuit or between the first switch circuit and the first node. The control circuit is configured to output a first control signal to control on and off states of the first switch circuit. The storage unit is coupled to the control circuit and configured to store a configuration state of the first bonding pad. In a first mode, the control circuit is configured to control the first switch circuit to be turned on, and write the configuration state of the first bonding pad to the storage unit. In a second mode, the control circuit controls the first switch circuit to be turned off.

Therefore, the integrated circuit chip and the configuration adjustment method for the same according to the present disclosure can store a value of a bonding option setting or a hardware strapping setting of an input/output pad to the storage unit, even if the bonding option setting or the hardware strapping setting is different from a direction for pulling a voltage level of the input/output pad to high or low potential, a DC leakage path can be avoided and the power consumption of the integrated circuit chip can be reduced in most operational statuses of the integrated circuit chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
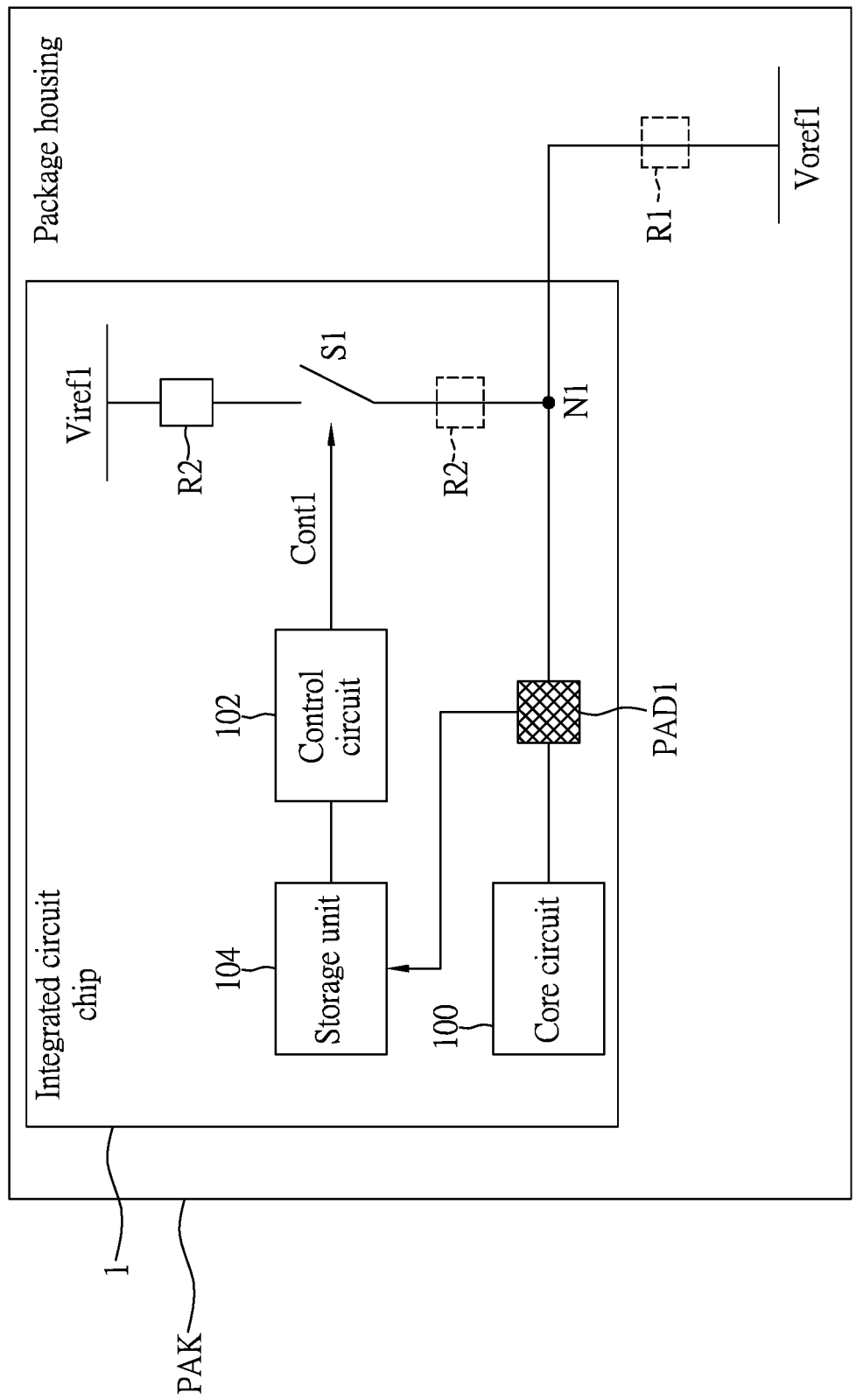
FIG. 1 shows a circuit layout of an integrated circuit chip according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a circuit layout of an integrated circuit chip according to a first embodiment of the present disclosure. As shown in FIG. 1, the first embodiment of the present disclosure provides an integrated circuit chip 1 including a core circuit 100, a first bonding pad PAD1, a first switch circuit S1, a second configuration resistor R2, a control circuit 102, and a storage unit 104.

Here, the core circuit 100 refers to a circuit part for providing primary core functions of the integrated circuit chip. Generally, the core circuit 100 has one or more signal input/output ends.

The first bonding pad PAD1 is coupled to the core circuit 100, and is coupled to the first external reference voltage Voref1 through the first node N1. The first node N1 is coupled to the first external reference voltage Voref1 through the bonding wire or the first configuration resistor R1.

The first switch circuit S1 is coupled between the first internal reference voltage Viref1 and the first node N1. The second configuration resistor R2 can be disposed on a circuit path between the first node N1 to the first internal reference voltage Viref1. For example, the second configuration resistor R2 can be coupled between the first internal reference voltage Viref1 and the first switch circuit S1, or between the first switch circuit S1 and the first node N1, as shown by a dotted line of FIG. 1.

The control circuit 102 can be, for example, a microcontroller configured to output a first control signal Cont1 to control on and off states of the first switch circuit S1. The storage unit 104 is coupled to the control circuit and configured to store a configuration state of the first bonding pad PAD1.

The control circuit 102 outputs a first control signal Cont1 to the first switch circuit S1 according to a configuration mode of the integrated circuit chip 1, so that the first switch circuit S1 electrically conducts the first internal reference voltage Viref1 pre-configured inside the integrated circuit chip 1 and the first bonding pad PAD1 according to the control signal Cont1. The first internal reference voltage Viref1 having a relatively high potential causes the first bonding pad PAD1 to have a predetermined configuration 1, and the first internal reference voltage Viref1 having a relatively low potential causes the first bonding pad PAD1 to have a predetermined configuration of 0.

Here, the storage unit 104 can be a register, which can be separately provided with the control circuit 102 or included in the control circuit 102. The register can be configured to store predetermined configuration states used to determine operational statuses of the integrated circuit chip 1, and values stored in the register can be written by executing a firmware or software code.

The control circuit 102 can be operated to enter the first mode and the second mode after a system including the integrated circuit chip 1 is powered on. In a first mode, the control circuit 102 is configured to control the first switch circuit S1 to be turned on, and write a configuration state of the first bonding pad PAD1 to the storage unit 104. In a second mode, the control circuit 102 controls the first switch circuit S1 to be turned off.

It should be noted that, after the control circuit 102 controls the first switch circuit S1 to be turned on in the first mode, the control circuit 102 writes the configuration state of the first bonding pad PAD1 to the storage unit 104 after a delay time elapses. If the configuration state of the first bonding pad PAD1 is read directly after the system is powered on and during a period when a power of the system is not stabilized, an erroneous configuration state may be recorded. Therefore, the control circuit 102 can be internally provided with a delay circuit. When the system voltage is stabilized after the predetermined delay time designed elapses, the control circuit 102 can write the configuration state correctly to the storage unit 104.

In the present embodiment, the integrated circuit chip 1 is disposed within a package housing PAK, the bonding wire or the first configuration resistor R1, and the first external reference voltage Voref1 are disposed in the package housing PAK. In other words, the present embodiment is mainly applied to bonding option settings. As shown in FIG. 1, a potential of the first internal reference voltage Viref1 is higher than a potential of the first external reference voltage Voref1. For example, the first internal reference voltage Viref1 may be an in-chip power supply VDD, and the first external reference voltage Voref1 may be the voltage at a ground end. In this case, if the first configuration resistor R1 is used in the integrated circuit chip 1, a resistance of the second configuration resistor R2 must be higher than a resistance of the first configuration resistor R1.

Figure 2:
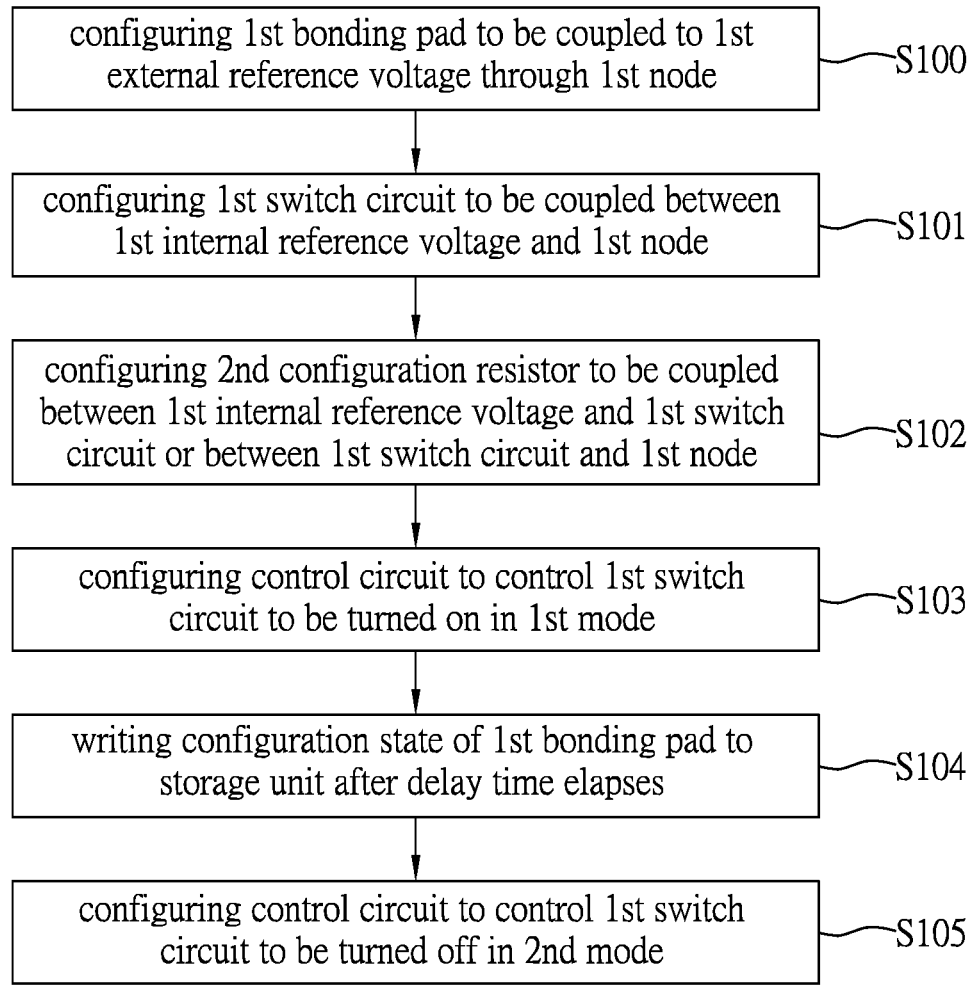
FIG. 2 is a flow chart showing a configuration adjustment method for an integrated circuit chip according to the first embodiment of the present disclosure.

Reference is now made to FIG. 2 for practical applications. FIG. 2 is a flow chart showing a configuration adjustment method for an integrated circuit chip according to the first embodiment of the present disclosure.

As shown in FIG. 2, the configuration adjustment method includes the following steps:

Step S100: configuring the first bonding pad PAD1 to be coupled to the first external reference voltage Voref1 through the first node N1. Here, the first node N1 is coupled to the first external reference voltage Voref1 through the bonding wire or the first configuration resistor R1. In the present embodiment, the first bonding pad PAD1 is preset as an input pin.

Step S101: configuring the first switch circuit S1 to be coupled between the first internal reference voltage Viref1 and the first node N1.

Step S102: configuring the second configuration resistor R2 to be coupled between the first internal reference voltage Viref1 and the first switch circuit S1 or between the first switch circuit S1 and the first node N1.

Step S103: configuring the control circuit 102 to control the first switch circuit S1 to be turned on in the first mode.

Step S104: writing the configuration state of the first bonding pad PAD1 to the storage unit 104 after the delay time elapses.

Step S105: configuring the control circuit 102 to control the first switch circuit S1 to be turned off in the second mode.

Therefore, after the system is powered on and stabilized, the control circuit 102 first stores a value of the configuration state of the first bonding pad PAD1 to the storage unit 104, and then disconnects a path in which the first bonding pad PAD1 is pulled to a high potential. Therefore, even if the bonding option setting is different from a direction in which the voltage level of the first bonding pad PAD1 is pulled to the high potential, a DC leakage path can be avoided and the power consumption of the integrated circuit chip 1 can be saved during operation of the integrated circuit chip 1.

Second Embodiment

Figure 3:
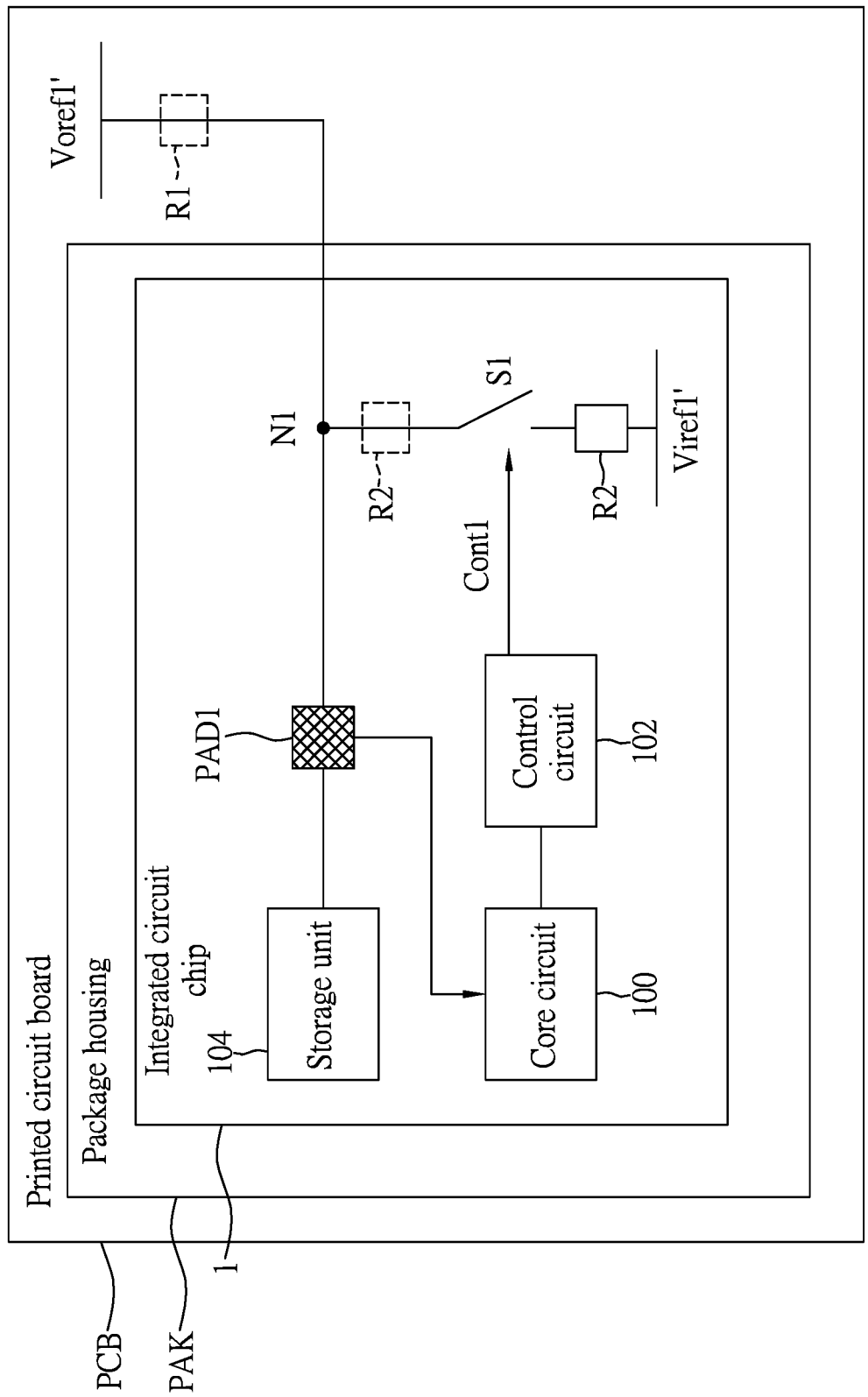
FIG. 3 shows a circuit layout of an integrated circuit chip according to a second embodiment of the present disclosure.

Reference is made to FIG. 3, which is a circuit layout of an integrated circuit chip according to a second embodiment of the present disclosure. As shown in FIG. 3, the second embodiment of the present disclosure provides an integrated circuit chip 1 including a core circuit 100, a first bonding pad PAD1, a first switch circuit S1, a second configuration resistor R2, a control circuit 102, and a storage unit 104.

In the present embodiment, most of the elements have been described in the first embodiment, and repeated description is omitted herefrom. The difference between this embodiment and the first embodiment is that the first bonding pad PAD1 of this embodiment is coupled to another first internal reference voltage Viref1' through the first node N1 and the first switch circuit S1, and is coupled to another first external reference voltage Voref1' through the first node N1 and the first configuration resistor R1. The first internal reference voltage Viref1' has a relatively low potential, for example, may be a ground end, and the first external reference voltage Voref1' may have a relatively high potential.

On the other hand, the present embodiment is mainly applied for hardware strapping settings. Therefore, the integrated circuit chip 1 is further disposed in a package housing PAK, and the package housing PAK, the first configuration resistor R1 and the first external reference voltage Voref1' are placed on the printed circuit board PCB. In this case, a resistance of the second configuration resistor R2 must be higher than a resistance of the first configuration resistor R1.

Figure 4:
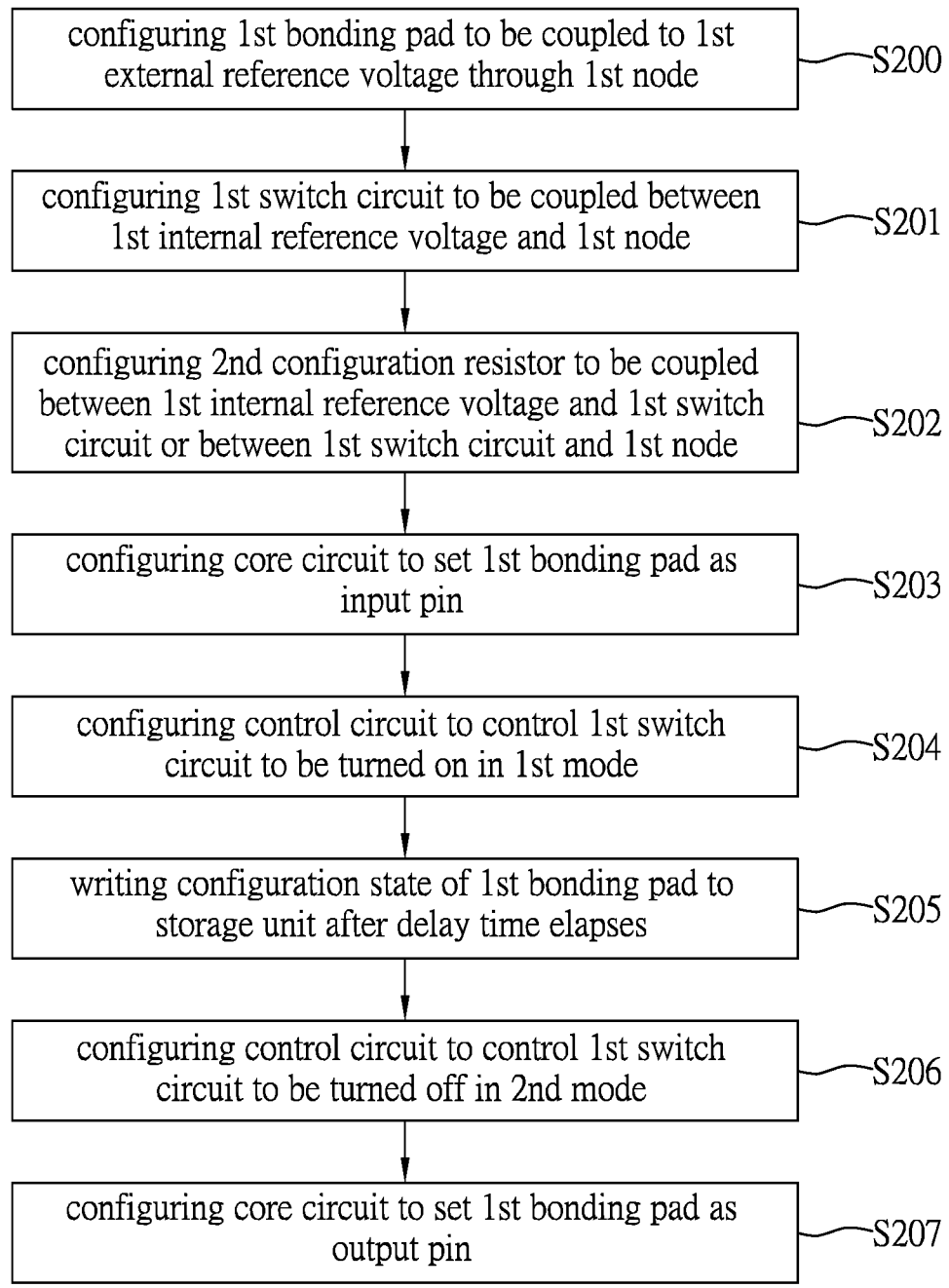
FIG. 4 is a flow chart showing a configuration adjustment method for an integrated circuit chip according to the second embodiment of the present disclosure.

Reference is now made to FIG. 4 for practical applications. FIG. 4 is a flow chart showing a configuration adjustment method for an integrated circuit chip according to the second embodiment of the present disclosure.

As shown in FIG. 4, the configuration adjustment method includes the following steps:

Step S200: configuring the first bonding pad PAD1 to be coupled to the first external reference voltage Voref1' through the first node N1. Here, the first node N1 is coupled to the first external reference voltage Voref1' through the first configuration resistor R1. In the present embodiment, the first bonding pad PAD1 is preset as an output pin.

Step S201: configuring the first switch circuit S1 to be coupled between the first internal reference voltage Viref1' and the first node N1.

Step S202: configuring the second configuration resistor R2 to be coupled between the first internal reference voltage Viref1' and the first switch circuit S1 or between the first switch circuit S1 and the first node N1.

Step S203: configuring the core circuit 100 to set the first bonding pad PAD1 as an input pin.

Step S204: configuring the control circuit 102 to control the first switch circuit S1 to be turned on in the first mode.

Step S205: writing the configuration state of the first bonding pad PAD1 to the storage unit 104 after the delay time elapses.

Step S206: configuring the control circuit 102 to control the first switch circuit S1 to be turned off in the second mode.

Step S207: configuring the core circuit 100 to set the first bonding pad PAD1 as the output pin.

Therefore, after the system is powered on and stabilized, the control circuit 102 first stores a value of the configuration state of the first bonding pad PAD1 to the storage unit 104, and then disconnects a path in which the first bonding pad PAD1 is pulled to a low potential. Therefore, even if the hardware strapping setting is different from a direction in which the voltage level of the first bonding pad PAD1 is pulled to the high potential, a DC leakage path can be avoided and the power consumption of the integrated circuit chip 1 can be saved in most operational status of the integrated circuit chip 1.

Third Embodiment

Figure 5:
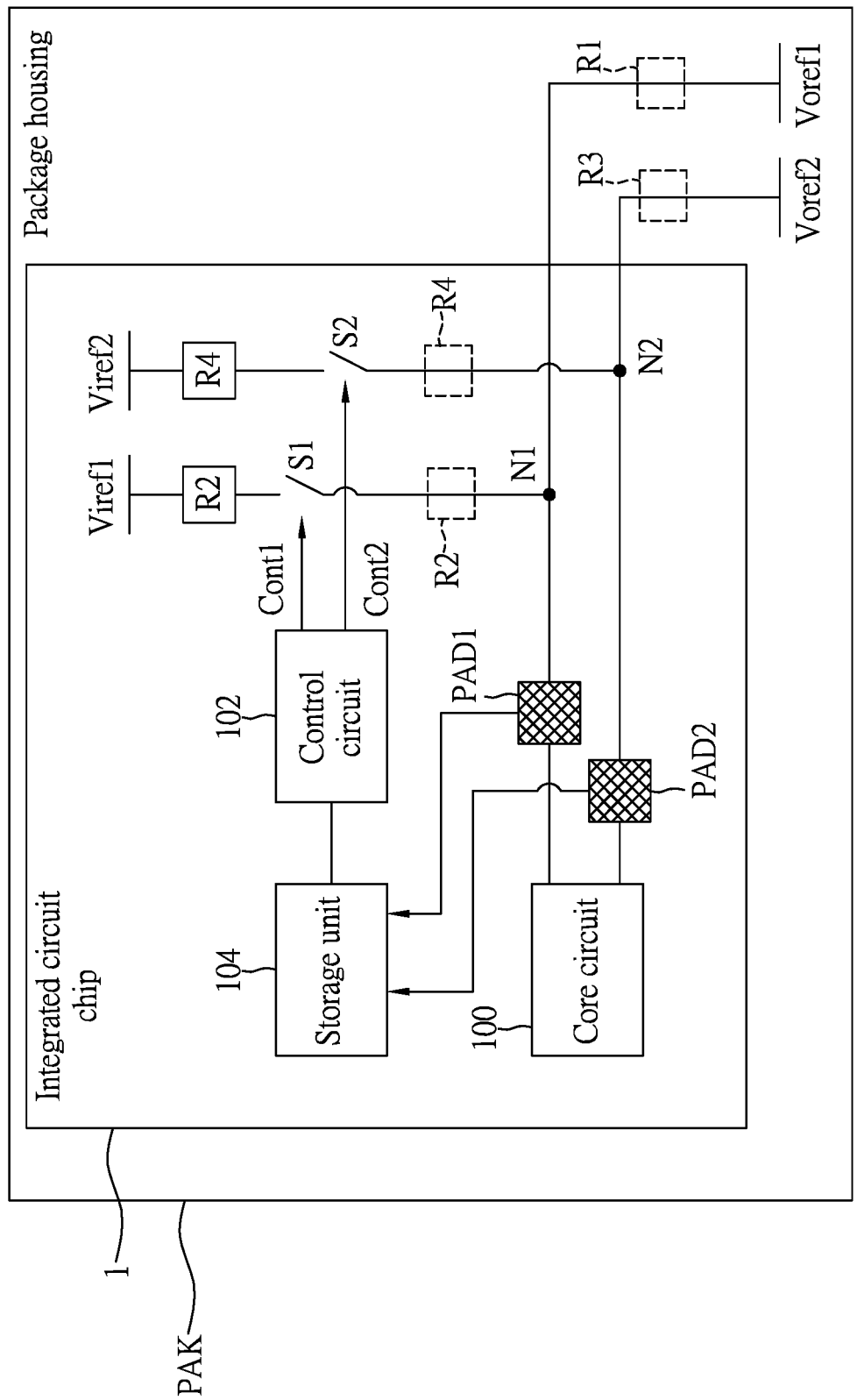
FIG. 5 shows a circuit layout of an integrated circuit chip according to a third embodiment of the present disclosure.

Reference is made to FIG. 5, which is a circuit layout of an integrated circuit chip according to a third embodiment of the present disclosure. As shown in FIG. 5, the third embodiment of the present disclosure provides an integrated circuit chip 1 including a core circuit 100, a first bonding pad PAD1, a second bonding pad PAD2, a first switch circuit S1, a second switch circuit S2, a first configuration resistor R1, a second configuration resistor R2, a third configuration circuit R3, a fourth configuration resistor R4, a control circuit 102, and a storage unit 104.

In the present embodiment, most of the elements have been described in the first embodiment, and the repeated description is omitted. Differently, the integrated circuit chip 1 further includes the second bonding pad PAD2, which is coupled to a second internal reference voltage Viref2 through a second node N2 and the second switch circuit S2, and is coupled to a second external reference voltage Voref2 through another bonding wire or the third configuration resistor R3, and the second node N2. The fourth configuration resistor R4 is disposed between the second switch circuit S2 and the second internal reference voltage Viref2, the first internal reference voltage Viref1 and the second internal reference voltage Viref2 each has a relatively high potential, for example, may be an in-chip power supply VDD, and the first external reference voltage Voref1 and the second external reference voltage Voref2 may have a relatively low potential, for example, ground ends.

The control circuit 102 is configured to output a second control signal Cont2 to control on and off states of the second switch circuit S2. The storage unit 104 is further configured to store a configuration state of the second bonding pad PAD2.

On the other hand, the present embodiment is mainly applied for bonding option settings. Therefore, the integrated circuit chip 1 is further disposed in a package housing PAK, and the first configuration resistor R1 (if present), the third configuration resistor R3 (if present), the first external reference voltage Voref1 and the second external reference voltage Voref2 are placed in the package housing PAK. In this case, a resistance of the second configuration resistor R2 must be higher than a resistance of the first configuration resistor R1, and a resistance of the fourth configuration resistor R4 must be higher than a resistance of the third configuration resistor R3.

Figure 6:
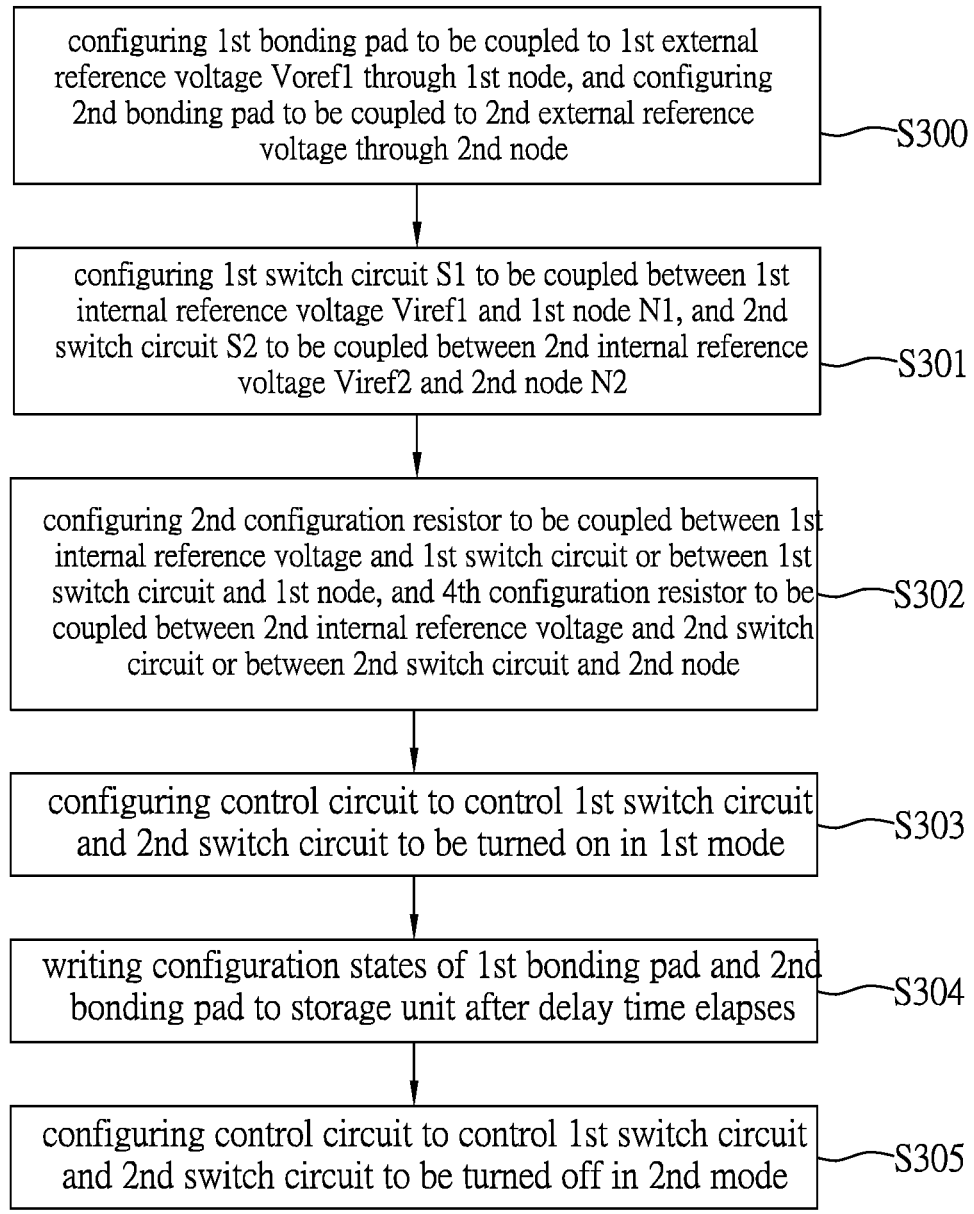
FIG. 6 is a flow chart showing a configuration adjustment method for an integrated circuit chip according to the third embodiment of the present disclosure.

Reference is now made to FIG. 6 for practical applications. FIG. 6 is a flow chart showing a configuration adjustment method for an integrated circuit chip according to the third embodiment of the present disclosure.

As shown in FIG. 6, the configuration adjustment method includes the following steps:

Step S300: configuring the first bonding pad PAD1 to be coupled to the first external reference voltage Voref1 through the first node N1, and configuring the second bonding pad PAD2 to be coupled to the second external reference voltage Voref2 through the second node N2. Here, the first node N1 is coupled to the first external reference voltage Voref1 through a bonding wire or the first configuration resistor R1, and the second node N2 is coupled to the second external reference voltage Voref2 through another bonding wire or the third configuration resistor R3. In the present embodiment, the first bonding pad PAD1 and the second bonding pad PAD2 are preset as input pins.

Step S301: configuring the first switch circuit S1 to be coupled between the first internal reference voltage Viref1 and the first node N1, and configuring the second switch circuit S2 to be coupled between the second internal reference voltage Viref2 and the second node N2.

Step S302: configuring the second configuration resistor R2 to be coupled between the first internal reference voltage Viref1 and the first switch circuit S1 or between the first switch circuit S1 and the first node N1, and configuring the fourth configuration resistor R4 to be coupled between the second internal reference voltage Viref2 and the second switch circuit S2 or between the second switch circuit S2 and the second node N2.

Step S303: configuring the control circuit 102 to control the first switch circuit S1 and the second switch circuit to be turned on in the first mode.

Step S304: writing the configuration states of the first bonding pad PAD1 and the second bonding pad PAD2 to the storage unit 104 after the delay time elapses.

Step S305: configuring the control circuit 102 to control the first switch circuit S1 and the second switch circuit S2 to be turned off in the second mode. Therefore, after the system is powered on and stabilized, the control circuit 102 first stores values of the configuration states of the first bonding pad PAD1 and the second bonding pad PAD2 to the storage unit 104, and then disconnects paths in which the first bonding pad PAD1 and the second bonding pad PAD2 are respectively pulled to the high potentials. Therefore, even if the bonding option setting is different from a direction in which the voltage level of the first bonding pad PAD1 and the second bonding pad PAD2 are respectively pulled to the high potentials, DC leakage paths can be avoided and the power consumption of the integrated circuit chip 1 can be saved in the operational status of the integrated circuit chip 1.

Therefore, the integrated circuit chip and the configuration adjustment method for the same according to the present disclosure can store a value of a bonding option setting or a hardware strapping setting of an input/output pad to the storage unit, even if the bonding option setting or the hardware strapping setting is different from a direction for pulling a voltage level of the input/output pad to high or low potential, a DC leakage path can be avoided and the power consumption of the integrated circuit chip can be saved in most operational status of the integrated circuit chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An integrated circuit chip comprising:
a core circuit;
a first bonding pad coupled to the core circuit and coupled to a first external reference voltage through a first node, wherein the first node is coupled to the first external reference voltage through a bonding wire or a first configuration resistor;
a first switch circuit coupled between a first internal reference voltage and the first node;
a second configuration resistor coupled between the first internal reference voltage and the first switch circuit or between the first switch circuit and the first node;
a control circuit configured to output a first control signal to control on and off states of the first switch circuit; and
a storage unit coupled to the control circuit and configured to store a configuration state of the first bonding pad;

wherein in a first mode, the control circuit is configured to control the first switch circuit to be turned on, and write the configuration state of the first bonding pad to the storage unit, and wherein in a second mode, the control circuit controls the first switch circuit to be turned off.

2. The integrated circuit chip according to claim 1, wherein in the first mode, the control circuit controls the first switch circuit to be turned on, and is further configured to write the configuration state of the first bonding pad to the storage unit.

3. The integrated circuit chip according to claim 1, wherein the integrated circuit chip is disposed in a package housing, and the first external reference voltage and the bonding wire or the first configuration resistor are disposed in the package housing.

4. The integrated circuit chip according to claim 3, wherein the first bonding pad is preset to be an input pin.

5. The integrated circuit chip according to claim 1, wherein the integrated circuit chip is disposed in a package housing, and the package housing, the first configuration resistor, and the first external reference voltage are disposed on a printed circuit board.

6. The integrated circuit chip according to claim 5, wherein the first bonding pad is preset to be an output pin, and the core circuit is configured to set the first bonding pad as an input pin and operated in the first mode and the second mode, and after the configuration state of the first bonding pad is written to the memory cell, the core circuit is configured to set the first bonding pad as the output pin.

7. The integrated circuit chip according to claim 1, wherein a potential of the first internal reference voltage is higher than a potential of the first external reference voltage, and a resistance of the second configuration resistor is higher than a resistance of the first configuration resistor.

8. The integrated circuit chip according to claim 1, wherein a potential of the first internal reference voltage is lower than a potential of the first external reference voltage, and a resistance of the second configuration resistor is higher than a resistance of the first configuration resistor.

9. The integrated circuit chip according to claim 1, further comprising:
 a second bonding pad coupled to the core circuit and coupled to a second external reference voltage through a second node, wherein the second node is coupled to the first external reference voltage through another bonding wire or a third configuration resistor;
 a second switch circuit coupled between a second internal reference voltage and the second node; and
 a fourth configuration resistor coupled between the second internal reference voltage and the second switch circuit or between the second switch circuit and the second node;
 wherein the control circuit is configured to output a second control signal to control on and off states of the second switch circuit;
 wherein the storage unit is further configured to store a configuration state of the second bonding pad;
 wherein in a first mode, the control circuit is configured to control the second switch circuit to be turned on, and write the configuration state of the second bonding pad to the storage unit.
 wherein in the second mode, the control circuit is configured to control the second switch circuit to be turned off.

10. A configuration adjustment method for an integrated circuit chip including a core circuit and a first bonding pad coupled the core circuit, the configuration adjustment method comprising:
 configuring the first bonding pad to be coupled to a first external reference voltage through a first node, wherein the first node is coupled to the first external reference voltage through a bonding wire or a first configuration resistor;
 configuring a first switch circuit to be coupled between a first internal reference voltage and the first node;
 configuring a second configuration resistor to be coupled between the first internal reference voltage and the first switch circuit or between the first switch circuit and the first node;
 configuring a control circuit to output a first control signal to control on and off states of the first switch circuit;
 configuring a storage unit to be coupled to the control circuit to store a configuration state of the first bonding pad;
 configuring the control circuit to control the first switch circuit to be turned on and write the configuration state of the first bonding pad to the storage unit in a first mode; and
 configuring the control circuit to control the first switch circuit to be turned off in a second mode.

11. The configuration adjustment method according to claim 10, further comprising:
 configuring, after the control circuit controls the first switch circuit to be turned on in the first mode, the control circuit to write the configuration state of the first bonding pad to the storage unit after a delay time elapses.

12. The configuration adjustment method according to claim 10, wherein the integrated circuit chip is disposed in a package housing, and the first external reference voltage and the bonding wire or the first configuration resistor are disposed in the package housing.

13. The configuration adjustment method according to claim 12, wherein the first bonding pad is preset to be an input pin.

14. The configuration adjustment method according to claim 10, wherein the integrated circuit chip is disposed in a package housing, and the package housing, the first configuration resistor, and the first external reference voltage are disposed on a printed circuit board.

15. The configuration adjustment method according to claim 14, wherein the first bonding pad is preset as an output pin, and the adjustment configuration method further comprises:
 configuring the core circuit to set the first bonding pad as an input pin; and
 configuring the core circuit to be operated in the first mode and the second mode, and configuring the core circuit to set the first bonding pad as the output pin after the configuration state of the first bonding pad is written to the storage unit.

16. The configuration adjustment method according to claim 10, wherein a potential of the first internal reference voltage is higher than a potential of the first external reference voltage, and a resistance of the second configuration resistor is higher than a resistance of the first configuration resistor.

17. The configuration adjustment method according to claim 10, wherein a potential of the first internal reference voltage is lower than a potential of the first external reference voltage, and a resistance of the second configuration resistor is higher than a resistance of the first configuration resistor.

18. The configuration adjustment method according to claim 10, wherein the integrated circuit chip further includes a second bonding pad coupled to the core circuit, and the configuration adjustment method further comprises:
- configuring the second bonding pad to be coupled to a second external reference voltage through a second node, wherein the second node is coupled to the first external reference voltage through another bonding wire or a third configuration resistor;
- configuring a second switch circuit to be coupled between a second internal reference voltage and the second node;
- configuring a fourth configuration resistor to be coupled between the second internal reference voltage and the second switch circuit or between the second switch circuit and the second node;
- configuring the control circuit to output a second control signal to control on and off states of the second switch circuit;
- configuring the storage unit to store a configuration state of the second bonding pad;
- configuring the control circuit to control the second switch circuit to be turned on and write the configuration state of the second bonding pad to the storage unit in the first mode; and
- configuring the control circuit to control the second switch circuit to be turned off in the second mode.

* * * * *